(12) United States Patent
Taniguchi et al.

(10) Patent No.: US 10,523,177 B2
(45) Date of Patent: Dec. 31, 2019

(54) PIEZOELECTRIC THIN FILM RESONATOR AND FABRICATION METHOD OF THE SAME, FILTER, AND MULTIPLEXER

(71) Applicant: TAIYO YUDEN CO., LTD., Tokyo (JP)

(72) Inventors: Shinji Taniguchi, Tokyo (JP); Hiroomi Kaneko, Tokyo (JP); Hiroshi Kawakami, Tokyo (JP); Tokihiro Nishihara, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 14 days.

(21) Appl. No.: 16/008,845

(22) Filed: Jun. 14, 2018

(65) Prior Publication Data

US 2019/0007021 A1 Jan. 3, 2019

(30) Foreign Application Priority Data

Jul. 3, 2017 (JP) .................................. 2017-130356

(51) Int. Cl.
*H03H 9/02* (2006.01)
*H03H 3/02* (2006.01)
*H03H 9/13* (2006.01)
*H03H 9/17* (2006.01)
(Continued)

(52) U.S. Cl.
CPC .......... *H03H 9/02102* (2013.01); *H03H 3/02* (2013.01); *H03H 9/02015* (2013.01);
(Continued)

(58) Field of Classification Search
CPC .. H03H 9/02118; H03H 3/02; H03H 9/02015; H03H 9/02031; H03H 9/131;
(Continued)

(56) References Cited

U.S. PATENT DOCUMENTS 7,098,573 B2 8/2006 Stommer
8,664,835 B2 * 3/2014 Matsuda ............ H03H 9/02102
310/341

(Continued)

FOREIGN PATENT DOCUMENTS

JP 2006-109472 A 4/2006
JP 2013-34130 A 2/2013
JP 2015-119249 A 6/2015

*Primary Examiner* — Benny T Lee
*Assistant Examiner* — Hafizur Rahman
(74) *Attorney, Agent, or Firm* — Chen Yoshimura LLP

(57) ABSTRACT

A piezoelectric thin film resonator includes: a substrate; lower and upper electrodes located on the substrate; a piezoelectric film that has a lower piezoelectric film mainly composed of aluminum nitride and an upper piezoelectric film mainly composed of aluminum nitride, the lower piezoelectric film and the upper piezoelectric film being in contact with each other in at least a part of a resonance region where the lower electrode and the upper electrode face each other across at least a part of the piezoelectric film, and a fluorine concentration at a boundary face with which the lower piezoelectric film and the upper piezoelectric film are in contact being 0.03 atomic % or less; and an insulating film that is located between the lower piezoelectric film and the upper piezoelectric film in a region other than the at least a part of the resonance region and contains silicon oxide.

8 Claims, 17 Drawing Sheets

(51) Int. Cl.
*H03H 9/56* (2006.01)
*H03H 9/70* (2006.01)

(52) U.S. Cl.
CPC .... *H03H 9/02031* (2013.01); *H03H 9/02118* (2013.01); *H03H 9/131* (2013.01); *H03H 9/173* (2013.01); *H03H 9/175* (2013.01); *H03H 9/178* (2013.01); *H03H 9/562* (2013.01); *H03H 9/564* (2013.01); *H03H 9/568* (2013.01); *H03H 9/706* (2013.01); *H03H 2003/021* (2013.01); *H03H 2003/025* (2013.01)

(58) Field of Classification Search
CPC ........ H03H 9/173; H03H 9/175; H03H 9/178; H03H 9/562; H03H 9/564; H03H 9/568; H03H 9/706; H03H 2003/021; H03H 2003/025

USPC ........................................................ 333/133
See application file for complete search history.

(56) References Cited

U.S. PATENT DOCUMENTS

| | | | |
|---|---|---|---|
| 9,374,060 B2 | 6/2016 | Onda | |
| 2006/0103492 A1 | 5/2006 | Feng et al. | |
| 2013/0033151 A1 | 2/2013 | Ueda et al. | |
| 2013/0207515 A1* | 8/2013 | Taniguchi | H03H 9/02102 310/321 |
| 2015/0171826 A1 | 6/2015 | Sakashita et al. | |
| 2015/0207490 A1* | 7/2015 | Taniguchi | H03H 9/173 333/133 |
| 2017/0104465 A1 | 4/2017 | Burgess et al. | |

* cited by examiner

US 10,523,177 B2

PIEZOELECTRIC THIN FILM RESONATOR AND FABRICATION METHOD OF THE SAME, FILTER, AND MULTIPLEXER

CROSS-REFERENCE TO RELATED APPLICATION

This application is based upon and claims the benefit of priority of the prior Japanese Patent Application No. 2017-130356, filed on Jul. 3, 2017, the entire contents of which are incorporated herein by reference.

FIELD

A certain aspect of the present invention relates to a piezoelectric thin film resonator and a fabrication method of the same, a filter, and a multiplexer.

BACKGROUND

Filters and multiplexers having piezoelectric thin film resonators have been used for high-frequency circuits of wireless terminals such as mobile phones. The piezoelectric thin film resonator has a multilayered film including a lower electrode, a piezoelectric film, and an upper electrode that are stacked. The region where the lower electrode and the upper electrode face each other across at least a part of the piezoelectric film is a resonance region where the acoustic wave vibrates. It has been known to form the piezoelectric film with a lower piezoelectric film and an upper piezoelectric film and provide an insertion film between the lower piezoelectric film and the upper piezoelectric film in the outer peripheral region of the resonance region as disclosed in, for example, Japanese Patent Application Publication No. 2015-119249 (hereinafter, referred to as Patent Document 1).

SUMMARY OF THE INVENTION

According to a first aspect of the present invention, there is provided a piezoelectric thin film resonator including: a substrate; a lower electrode and an upper electrode located on the substrate; a piezoelectric film that has a lower piezoelectric film, which is located on the lower electrode and is mainly composed of aluminum nitride, and an upper piezoelectric film, which is located on the lower piezoelectric film and is mainly composed of aluminum nitride, the lower piezoelectric film and the upper piezoelectric film being in contact with each other in at least a part of a resonance region where the lower electrode and the upper electrode face each other across at least a part of the piezoelectric film, a fluorine concentration at a boundary face with which the lower piezoelectric film and the upper piezoelectric film are in contact being 0.03 atomic % or less; and an insulating film that is located between the lower piezoelectric film and the upper piezoelectric film in a region other than the at least a part of the resonance region and contains silicon oxide.

According to a second aspect of the present invention, there is provided a filter including the above piezoelectric thin film resonator.

According to a third aspect of the present invention, there is provided a multiplexer including the above filter.

According to a fourth aspect of the present invention, there is provided a method of fabricating a piezoelectric thin film resonator, the method including: forming a lower electrode on a substrate; forming a lower piezoelectric film mainly composed of aluminum nitride on the lower electrode; forming an insulating film containing silicon oxide on the lower piezoelectric film; etching the insulating film with an etching gas containing fluorine; reducing fluorine on an upper surface of the lower piezoelectric film after the etching of the insulating film; forming an upper piezoelectric film mainly composed of aluminum nitride so that the upper piezoelectric film is in contact with the upper surface of the lower piezoelectric film after the reducing of fluorine; and forming an upper electrode on the upper piezoelectric film so that the lower piezoelectric film and the upper piezoelectric film are in contact with each other in at least a part of a resonance region where the upper electrode and the lower electrode sandwich at least a part of a film including the lower piezoelectric film and the upper piezoelectric film.

DETAILED DESCRIPTION

In Patent Document 1, the Q-value is improved by providing an insertion film. The orientation of the upper piezoelectric film is enhanced by reducing the roughness of the upper surface of the lower piezoelectric film in the region where no insertion film is located. However, a fabricated piezoelectric thin film resonator having an insertion film may have a low electromechanical coupling coefficient.

Hereinafter, with reference to the drawings, embodiments will be described.

First Embodiment

Figure 1A:
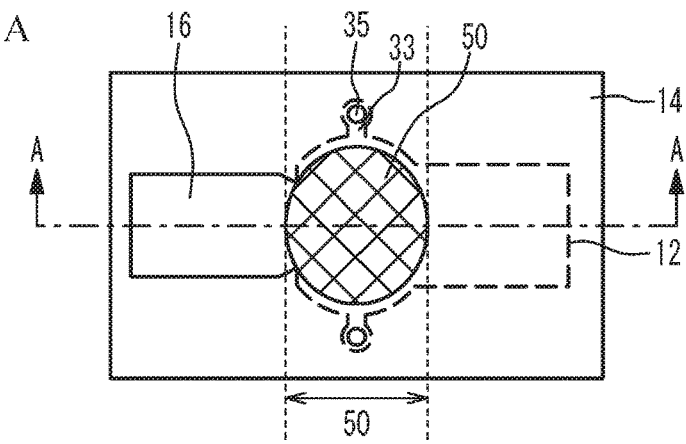
FIG. 1A is a plan view of a piezoelectric thin film resonator in accordance with a first embodiment.
Figure 1B:
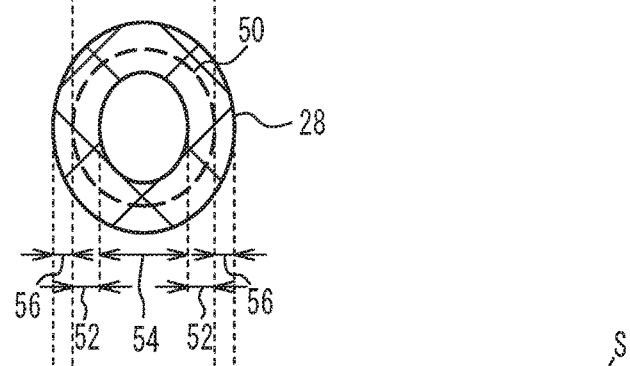
FIG. 1B is a plan view of an insertion film.
Figure 1C:
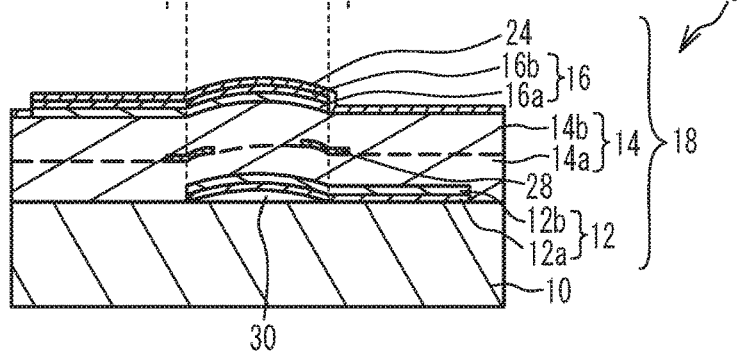
FIG. 1C and FIG. 1D are cross-sectional views taken along line A-A in FIG. 1A.
Figure 1D:
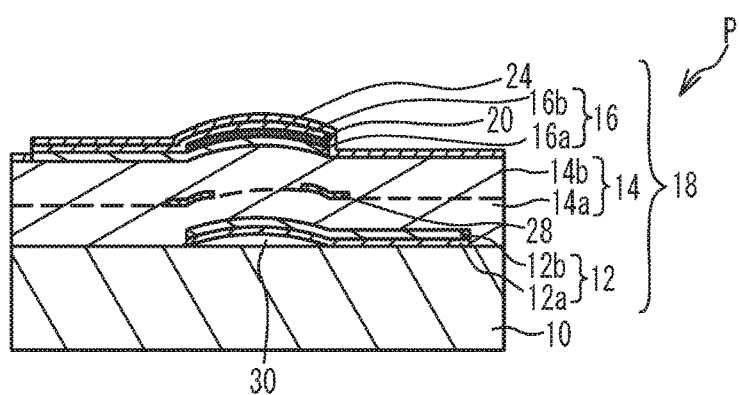

FIG. 1A is a plan view of a piezoelectric thin film resonator in accordance with a first embodiment, FIG. 1B is a plan view of an insertion film, and FIG. 1C and FIG. 1D are cross-sectional views taken along line A-A in FIG. 1A. FIG. 1C is a cross-sectional view of, for example, a series resonator of a ladder-type filter, and FIG. 1D is a cross-sectional view of, for example, a parallel resonator of the ladder-type filter.

With reference to FIG. 1A through FIG. 1C, the structure of a series resonator S will be described. A lower electrode 12 is located on a substrate 10. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at smaller distances to the center of the air gap 30, for example. The substrate 10 is, for example, a silicon (Si) substrate. The lower electrode 12 includes a lower layer 12a and an upper layer 12b. The lower layer 12a is, for example, a chrome (Cr) film, and the upper layer 12b is, for example, a ruthenium (Ru) film.

A piezoelectric film 14 is located on the lower electrode 12. The piezoelectric film 14 is an aluminum nitride film mainly composed of aluminum nitride having the main axis in the (002) direction. The piezoelectric film 14 has a lower piezoelectric film 14a, which is located on the lower electrode 12, and an upper piezoelectric film 14b, which is located on the lower piezoelectric film 14a. An insertion film 28 is located between the lower piezoelectric film 14a and the upper piezoelectric film 14b. The insertion film 28 is, for example, a silicon oxide film. The insertion film 28 is located in an outer peripheral region 52 within the resonance region 50, and is not located in a center region 54. The insertion film 28 is continuously located from the outer peripheral region 52 to the outside of the resonance region 50. In the center region 54, the lower piezoelectric film 14a and the upper piezoelectric film 14b are in contact with each other.

An upper electrode 16 is located on the piezoelectric film 14 so as to have a region (a resonance region 50) where the upper electrode 16 faces the lower electrode 12 across the piezoelectric film 14. The resonance region 50 has an elliptical shape, and is a region where the acoustic wave in the thickness extension mode resonates. The upper electrode 16 includes a lower layer 16a and an upper layer 16b. The lower layer 16a is, for example, an Ru film, and the upper layer 16b is, for example, a Cr film.

A silicon oxide film is formed as a frequency adjusting film 24 on the upper electrode 16. A multilayered film 18 in the resonance region 50 includes the lower electrode 12, the piezoelectric film 14, the insertion film 28, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 has hole portions 35 at the ends of the introduction path 33.

With reference to FIG. 1A and FIG. 1D, the structure of a parallel resonator P will be described. The parallel resonator P differs from the series resonator S in that a mass load film 20 formed of a titanium (Ti) layer is located between the lower layer 16a and the upper layer 16b of the upper electrode 16. Thus, the multilayered film 18 includes the mass load film 20 formed across the entire surface in the resonance region 50 in addition to the multilayered film of the series resonator S. Other structures are the same as those of the series resonator S illustrated in FIG. 1C, and the description thereof is thus omitted.

The difference in resonant frequency between the series resonator S and the parallel resonator P is adjusted by varying the film thickness of the mass load film 20. The resonant frequency of each of the series resonator S and the parallel resonator P is adjusted by varying the film thickness of the corresponding frequency adjusting film 24.

When the piezoelectric thin film resonator has a resonant frequency of 2 GHz, the lower layer 12a, formed of a Cr film, of the lower electrode 12 has a film thickness of 100 nm, and the upper layer 12b formed of an Ru film has a film thickness of 230 nm. The lower piezoelectric film 14a and the upper piezoelectric film 14b formed of AlN films have film thicknesses of 600 nm. The insertion film 28 formed of a silicon oxide film has a film thickness of 150 nm. The lower layer 16a, formed of an Ru film, of the upper electrode 16 has a film thickness of 230 nm, and the upper layer 16b formed of a Cr film has a film thickness of 50 nm. The frequency adjusting film 24 formed of a silicon oxide film has a film thickness of 50 nm. The mass load film 20 formed of a Ti film has a film thickness of 100 nm. The film thickness of each layer is appropriately set to achieve a desired resonance characteristic.

The substrate 10 may be a sapphire substrate, an alumina substrate, a spinel substrate, a quartz substrate, a glass substrate, a ceramic substrate, or a GaAs substrate instead of an Si substrate. The lower electrode 12 and the upper electrode 16 may be formed of a single-layer film of aluminum (Al), Ti, copper (Cu), molybdenum (Mo), tungsten (W), tantalum (Ta), platinum (Pt), rhodium (Rh), or iridium (Ir) or a multilayered film of at least two of them instead of Ru and Cr. For example, the lower layer 16a of the upper electrode 16 may be made of Ru, and the upper layer 16b may be made of Mo.

The piezoelectric film 14 may be mainly composed of aluminum nitride and contain another element for improving the resonance characteristic or the piezoelectricity. For example, the use of scandium (Sc), a Group II or Group XII element and a Group IV element, or a Group II or Group XII element and a Group V element as additive elements improves the piezoelectricity of the piezoelectric film 14.

Accordingly, the effective electromechanical coupling coefficient of the piezoelectric thin film resonator is improved. The Group II element is, for example, calcium (Ca), magnesium (Mg), or strontium (Sr). The Group XII element is, for example, zinc (Zn). The Group IV element is, for example, Ti, zirconium (Zr), or hafnium (Hf). The Group V element is, for example, Ta, niobium (Nb), or vanadium (V). Yet alternatively, the piezoelectric film 14 may be mainly composed of aluminum nitride and contain boron (B).

The insertion film 28 is made of a material having less Young's modulus and/or less acoustic impedance than the piezoelectric film 14, and is an insulating film containing silicon oxide.

The frequency adjusting film 24 may be a silicon nitride film or an aluminum nitride film instead of a silicon oxide film. The mass load film 20 may be a single-layer film of Ru, Cr, Al, Cu, Mo, W, Ta, Pt, Rh, or Ir instead of Ti. Alternatively, the mass load film 20 may be an insulating film made of, for example, metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower layer 16a and the upper layer 16b). The mass load film 20 may be larger than the resonance region 50 as long as the mass load film 20 is formed so as to include the resonance region 50.

Fabrication Method of the First Embodiment

Figure 2A:
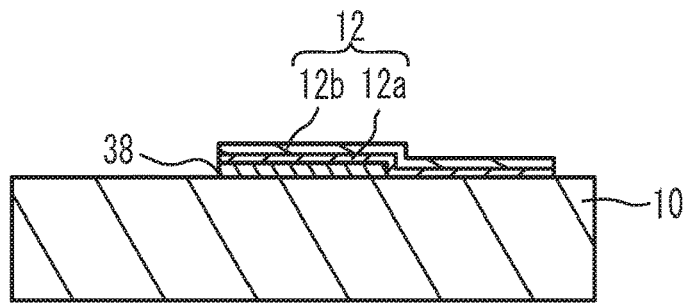
FIG. 2A through FIG. 2D are cross-sectional views (No. 1) illustrating a method of fabricating the piezoelectric thin film resonator in accordance with the first embodiment.

FIG. 2A through FIG. 3D are cross-sectional views illustrating a method of fabricating the piezoelectric thin film resonator in accordance with the first embodiment. As illustrated in FIG. 2A, a sacrifice layer 38 for forming an air gap is formed on the substrate 10 having a flat principal surface. The sacrifice layer 38 has a film thickness of, for example, 10 to 100 nm, and is made of a material such as MgO, ZnO, Ge, or $SiO_2$, which easily dissolves in an etching liquid or an etching gas. The sacrifice layer 38 is then patterned into a desired shape by photolithography and etching. The shape of the sacrifice layer 38 corresponds to the planar shape of the air gap 30, and includes, for example, a region to be the resonance region 50. The lower layer 12a and the upper layer 12b are formed as the lower electrode 12 on the sacrifice layer 38 and the substrate 10. The sacrifice layer 38 and the lower electrode 12 are formed by, for example, sputtering, vacuum evaporation, or Chemical Vapor Deposition (CVD). The lower electrode 12 is then patterned into a desired shape by photolithography and etching. The lower electrode 12 may be formed by liftoff.

Figure 2B:
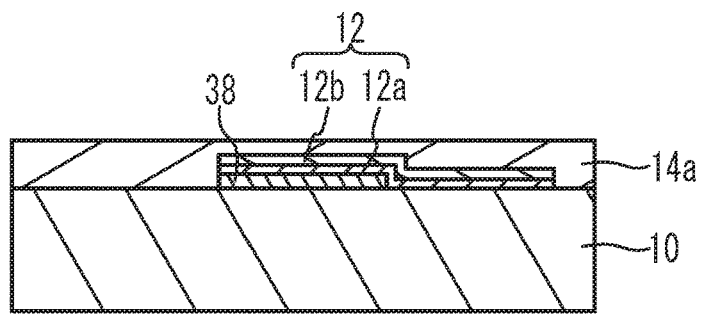

As illustrated in FIG. 2B, the lower piezoelectric film 14a mainly composed of aluminum nitride is formed on the lower electrode 12 and the substrate 10 by reactive magnetron sputtering. Nitrogen gas and argon gas are used as sputtering gas.

Figure 2C:
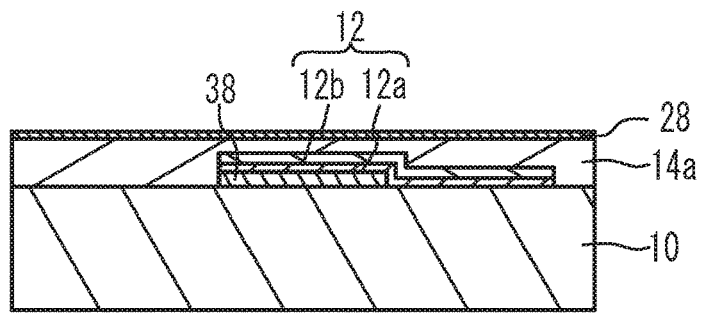
Figure 2D:
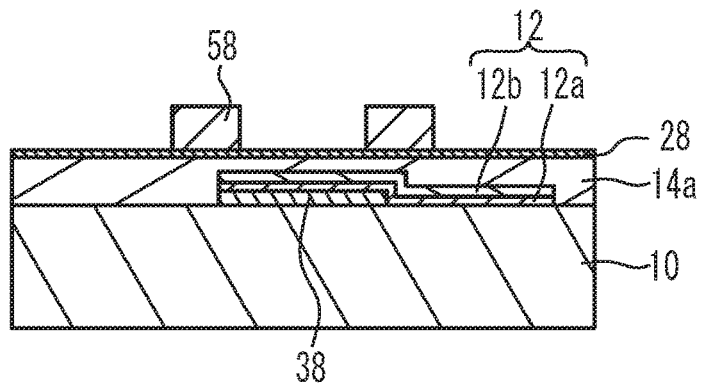

As illustrated in FIG. 2C, the insertion film 28, which is an insulating film containing silicon oxide, is formed on the lower piezoelectric film 14a by sputtering, vacuum evaporation, or CVD. As illustrated in FIG. 2D, a photoresist 58 is applied to the insertion film 28. The photoresist 58 is patterned by exposure and development.

Figure 3A:
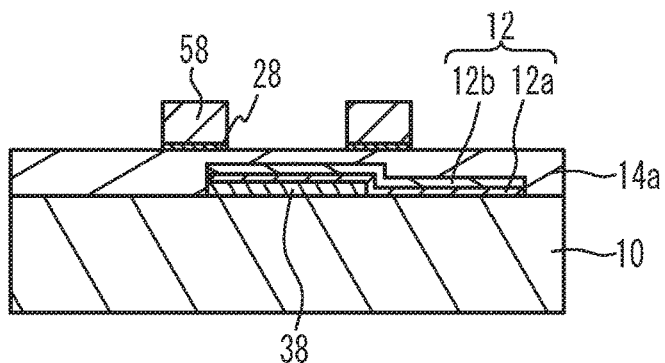
FIG. 3A through FIG. 3D are cross-sectional views (No. 2) illustrating the method of fabricating the piezoelectric thin film resonator in accordance with the first embodiment.

As illustrated in FIG. 3A, the insertion film 28 is dry etched using the photoresist 58 as a mask. Reactive Ion Etching (RIE) using $CF_4$ for an etching gas is used for dry etching. Instead of $CF_4$, for example, $CHF_3$, $C_2F_6$, or $SF_6$ may be used as an etching gas containing fluorine.

Figure 3B:
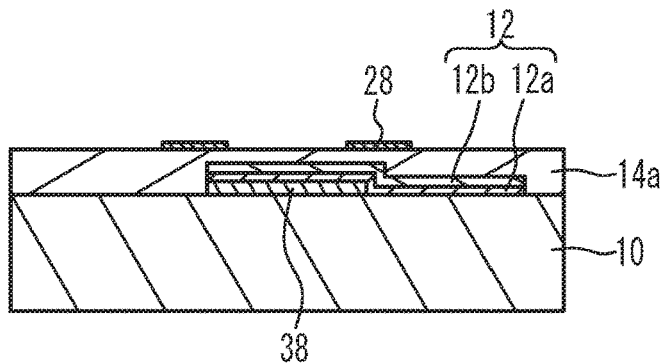

As illustrated in FIG. 3B, the photoresist 58 is removed. An organic chemical such as a peeling solution is used to remove the photoresist 58. Oxygen plasma may be used to remove the photoresist 58.

Figure 3C:
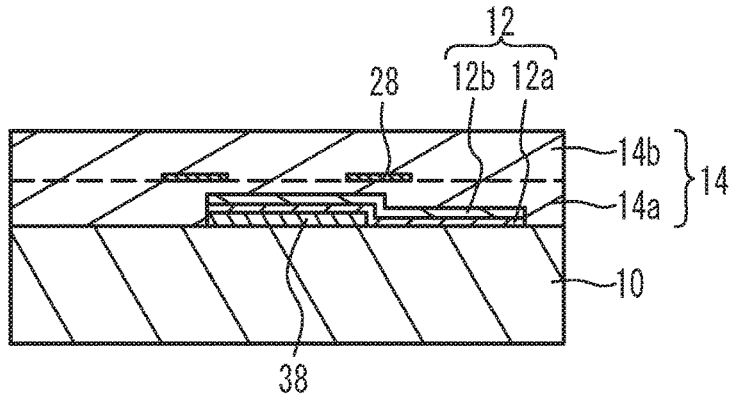

As illustrated in FIG. 3C, the upper piezoelectric film 14b is formed on the lower piezoelectric film 14a by reactive magnetron sputtering. Nitrogen gas and argon gas are used as sputtering gas. The lower piezoelectric film 14a and the upper piezoelectric film 14b form the piezoelectric film 14.

Figure 3D:
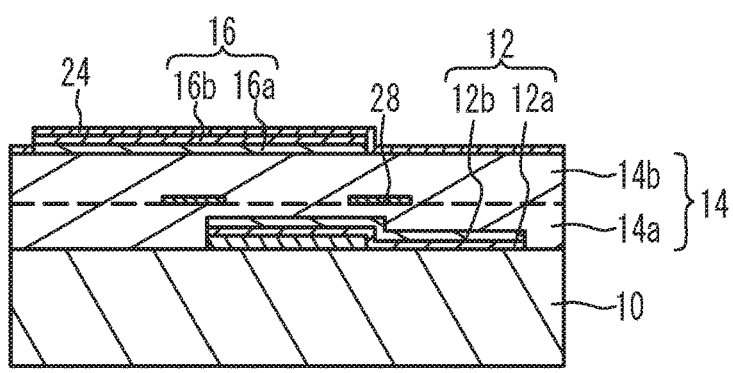

As illustrated in FIG. 3D, the lower layer 16a and the upper layer 16b of the upper electrode 16 are formed on the piezoelectric film 14 by, for example, sputtering, vacuum evaporation, or CVD. The upper electrode 16 is patterned into a desired shape by photolithography and etching. The upper electrode 16 may be formed by liftoff.

In the parallel resonator illustrated in FIG. 1D, after the lower layer 16a is formed, the mass load film 20 is formed by, for example, sputtering, vacuum evaporation, or CVD. The mass load film 20 is patterned into a desired shape by photolithography and etching. Thereafter, the upper layer 16b is formed.

The frequency adjusting film 24 is formed by, for example, sputtering or CVD. The frequency adjusting film 24 is patterned into a desired shape by photolithography and etching.

Thereafter, an etching liquid for etching the sacrifice layer 38 is introduced into the sacrifice layer 38 under the lower electrode 12 through the hole portions 35 and the introduction path 33 (see FIG. 1A). This process removes the sacrifice layer 38. A substance for etching the sacrifice layer 38 is preferably a substance that does not etch the materials constituting the resonator except the sacrifice layer 38. In particular, a substance used for etching is preferably a substance that does not etch the lower electrode 12 with which the substance comes in contact. The stress of the multilayered film 18 (see FIG. 1C and FIG. 1D) is set so as to be a compression stress. This setting causes the multilayered film 18 to bulge out to the opposite side to the substrate 10 so as to separate from the substrate 10 when the sacrifice layer 38 is removed. The air gap 30 having a dome-shaped bulge is formed between the lower electrode 12 and the substrate 10. The above processes complete the series resonator S illustrated in FIG. 1A and FIG. 1C, and the parallel resonator P illustrated in FIG. 1A and FIG. 1D.

Samples A and B

The piezoelectric thin film resonator fabricated by the fabrication method described in FIG. 2A through FIG. 3D may have a low electromechanical coupling coefficient $k^2$. The electromechanical coupling coefficient $k^2$ is low in a particular wafer or in some regions in a wafer. Samples A through C are defined as follows.

Sample A: The electromechanical coupling coefficient $k^2$ is normal (about 7%).

Sample B: The electromechanical coupling coefficient $k^2$ is low (5% or less).

Sample C: No insertion film 28 is formed and the lower piezoelectric film 14a is exposed to the atmosphere.

Other fabrication conditions of the samples A through C are the same as those of the piezoelectric thin film resonator having a resonant frequency of 2 GHz.

In the sample C, after the lower piezoelectric film 14a in FIG. 2B was formed, the insertion film 28 in FIG. 2C through FIG. 3B was not formed and the lower piezoelectric film 14a was exposed to the atmosphere. The upper piezoelectric film 14b was then formed.

Figure 4A:
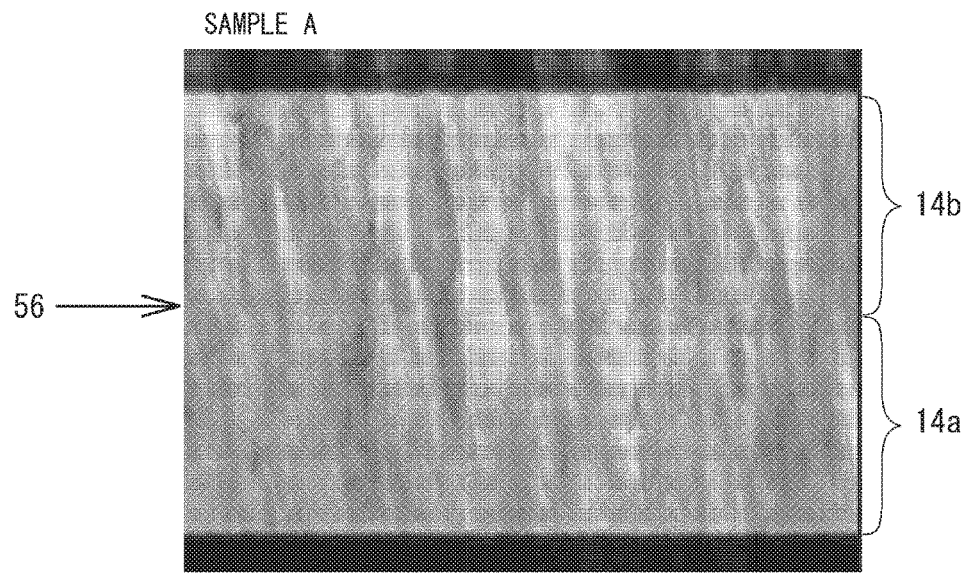
FIG. 4A and FIG. 4B are SEM images of cross-sections of piezoelectric films of samples A and B, respectively.
Figure 4B:
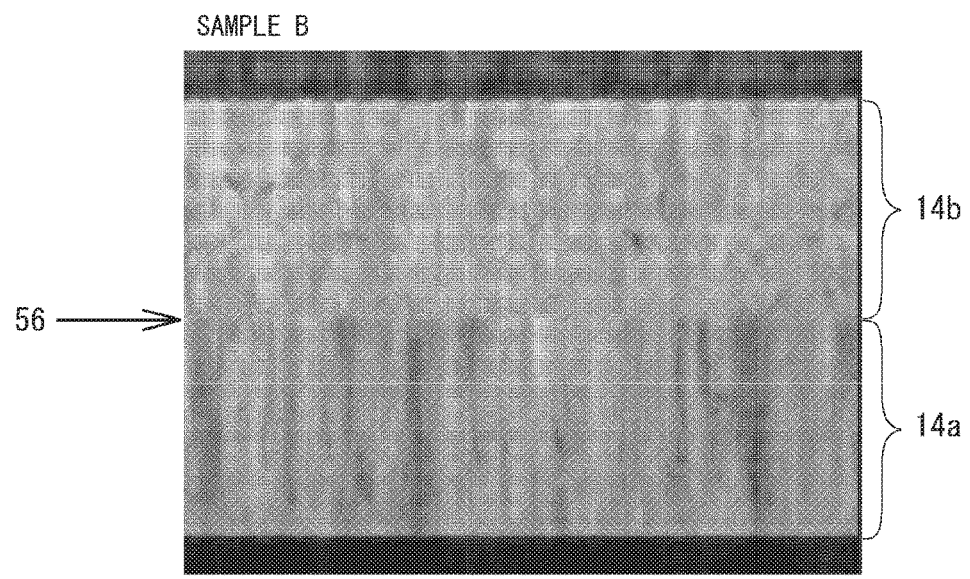

The cross-sections of the samples A and B were observed by Scanning Electron Microscope (SEM). FIG. 4A and FIG. 4B are respectively the SEM images of the cross sections of the piezoelectric films of the sample A and the sample B. The SEM image is the image of the region where the lower piezoelectric film 14a and the upper piezoelectric film 14b are in contact with each other.

As presented in FIG. 4A, a boundary face 56 is observed between the lower piezoelectric film 14a and the upper piezoelectric film 14b. In the sample A, a columnar structure is observed in each of the lower piezoelectric film 14a and the upper piezoelectric film 14b. These results reveal that the lower piezoelectric film 14a and the upper piezoelectric film 14b are good films with high orientation.

As presented in FIG. 4B, in the sample B, a columnar structure is observed in the lower piezoelectric film 14a. A columnar structure is not observed in the upper piezoelectric film 14b. Accordingly, it is considered that in the sample B, the electromechanical coupling coefficient is reduced because of bad crystallinity of the upper piezoelectric film 14b.

Concentrations of fluorine (F) and carbon (C) in the depth direction of the samples A and B were measured by Dynamic Secondary Ion Mass Spectrometry (D-SIMS). The measurement was conducted in the region near the center of the resonance region 50. Since there are many noises in the actual measurement, in the following figures, the measurement results of depth and concentration are schematically illustrated. A depth of around 0.7 μm is near the boundary face 56 between the lower piezoelectric film 14a and the upper piezoelectric film 14b.

Figure 5A:
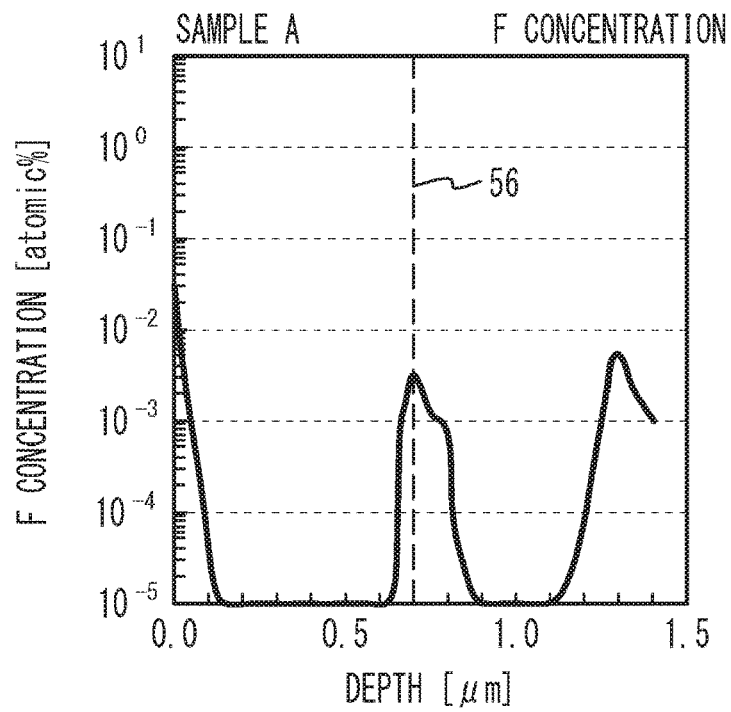
FIG. 5A is a schematic view illustrating an F concentration with respect to a depth in the sample A.
Figure 5B:
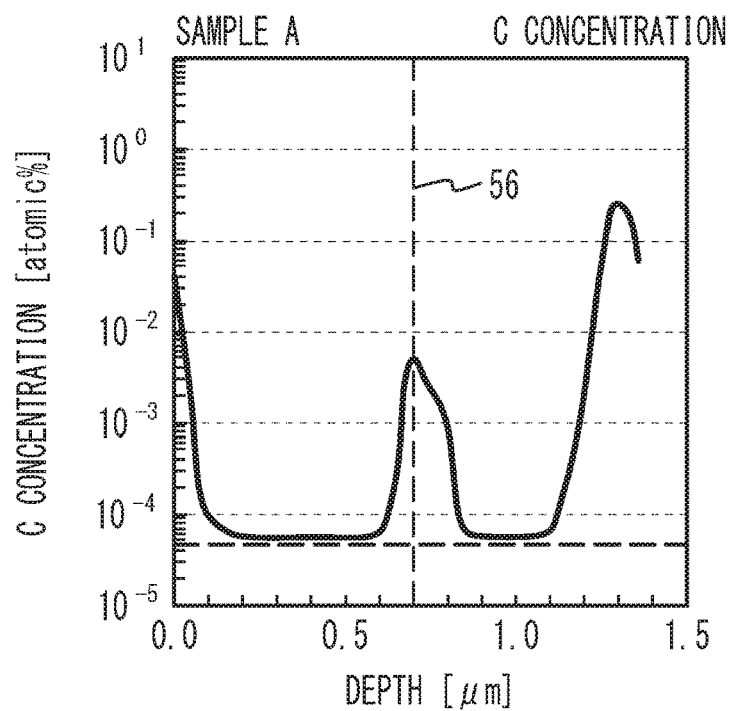
FIG. 5B is a schematic view illustrating a C concentration with respect to a depth in the sample A.

FIG. 5A is a schematic view illustrating an F concentration with respect to a depth in the sample A, and FIG. 5B is a schematic view illustrating a C concentration with respect to a depth in the sample A. A dashed line of $5 \times 10^{-5}$ atomic % indicates a measurement limit in FIG. 5B. The same applied to the figures for C concentration. As illustrated in FIG. 5A and FIG. 5B, the peaks of the F concentration and the C concentration are observed near the boundary face 56. The peak F concentration is approximately $3 \times 10^{-3}$ atomic %, and the peak C concentration is approximately $7 \times 10^{-3}$ atomic %.

Figure 6A:
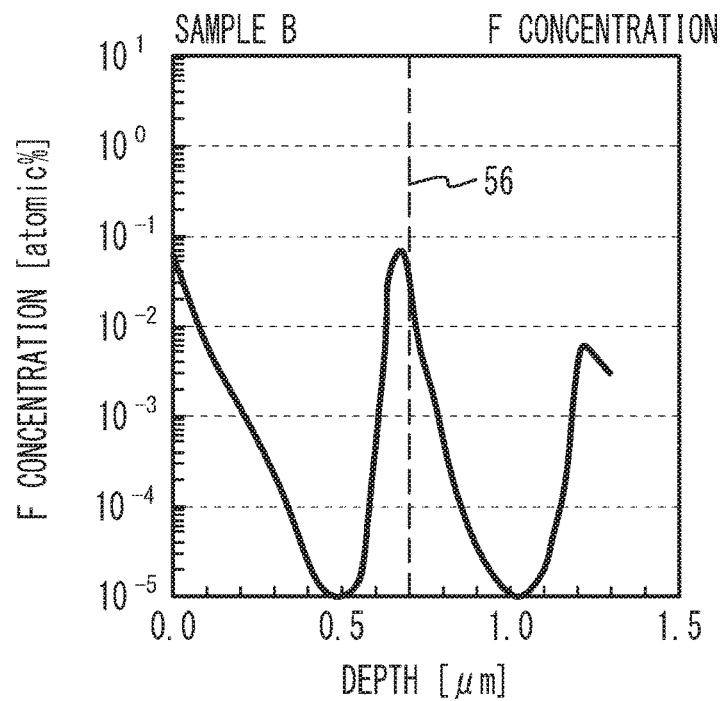
FIG. 6A is a schematic view illustrating an F concentration with respect to a depth in the sample B.
Figure 6B:
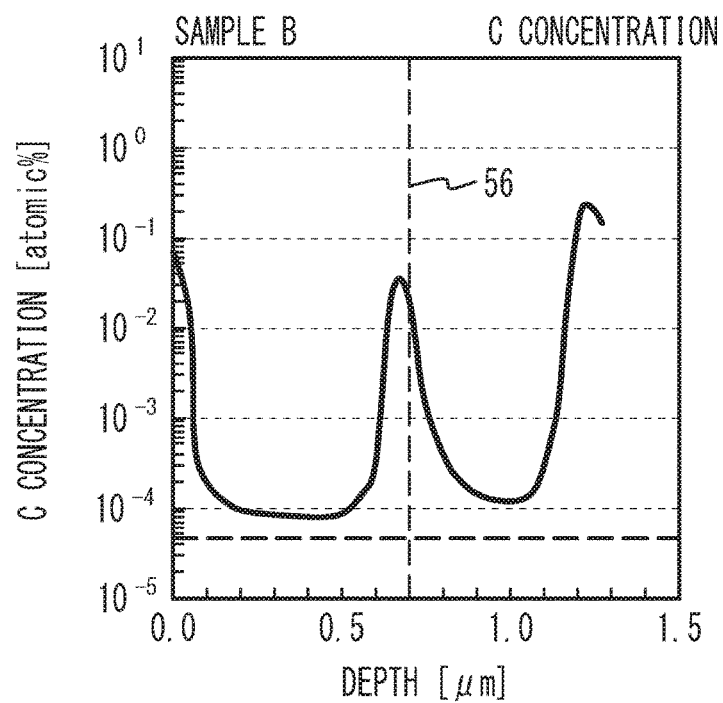
FIG. 6B is a schematic view illustrating a C concentration with respect to a depth in the sample B.

FIG. 6A is a schematic view illustrating an F concentration with respect to a depth in the sample B, and FIG. 6B is a schematic view illustrating a C concentration with respect to a depth in the sample B. As illustrated in FIG. 6A and FIG. 6B, the peaks of the F concentration and the C concentration are observed near the boundary face 56. The peak F concentration is approximately $8 \times 10^{-2}$ atomic %, and the C concentration is approximately $4 \times 10^{-2}$ atomic %.

Figure 7A:
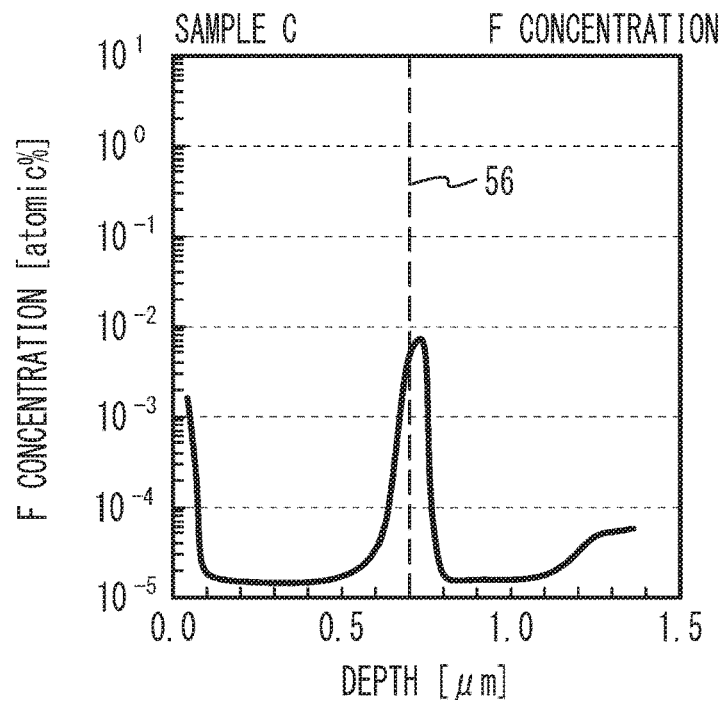
FIG. 7A is a schematic view illustrating an F concentration with respect to a depth in a sample C.
Figure 7B:
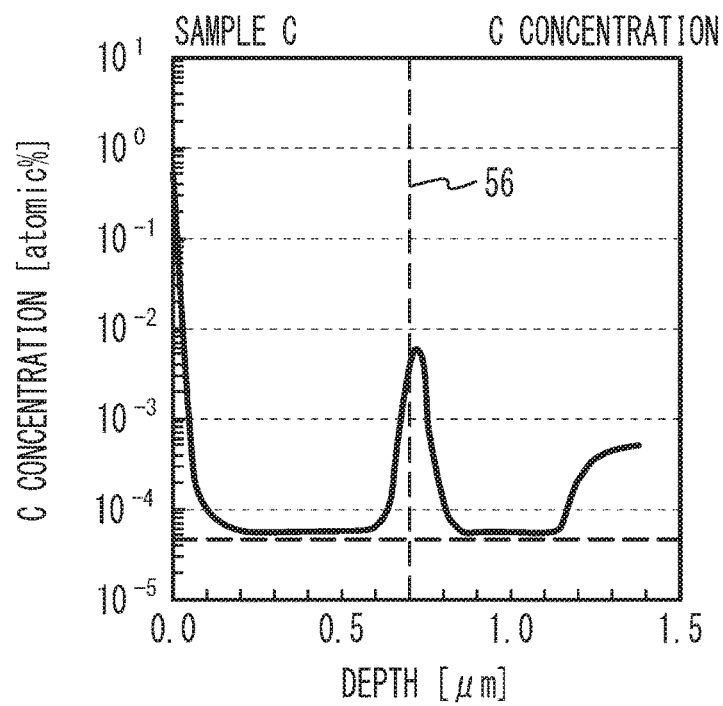
FIG. 7B is a schematic view illustrating a C concentration with respect to a depth in the sample C.

FIG. 7A is a schematic view illustrating an F concentration with respect to a depth in the sample C, and FIG. 7B is a schematic view illustrating a C concentration with respect to a depth in the sample C. As illustrated in FIG. 7A and FIG. 7B, the peaks of the F concentration and the C concentration are observed near the boundary face 56. The peak F concentration is approximately $8 \times 10^{-3}$ atomic %, and the peak C concentration is approximately $8 \times 10^{-3}$ atomic %.

As illustrated in FIG. 5A through FIG. 7B, the F concentration and the C concentration near the boundary face 56 in the sample B are an order of magnitude greater than those in the samples A and C. Since the F concentration and the C concentration near the boundary face 56 are almost the same between the samples A and C, it is considered that the peaks of the F concentration and the C concentration near the boundary face in the sample A are due to atmospheric exposure. On the other hand, it is considered that the large peaks of the F concentration and the C concentration near the boundary face in the sample B is due to the step for forming the insertion film 28.

Figure 8:
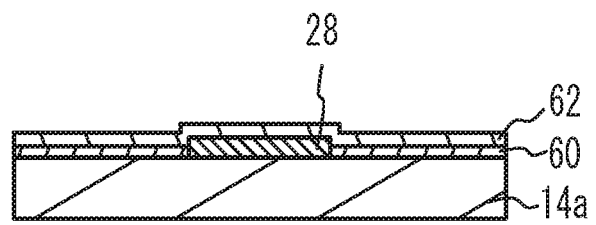
FIG. 8 is a cross-sectional view of a lower piezoelectric film after the insertion film is formed.

Thus, it is surmised as follows. FIG. 8 is a cross-sectional view of the lower piezoelectric film after the insertion film is formed. As illustrated in FIG. 8, an AlF-based film 60 (or AlF-based residues) are formed on the upper surface of the lower piezoelectric film 14a. An organic substance containing film 62 (or organic substance containing residues) are formed on the film 60 and the insertion film 28.

In FIG. 3A, when the insertion film 28 is a film containing silicon oxide, the insertion film 28 is removed by dry etching using an etching gas containing fluorine. This is because the dimension accuracy of the insertion film 28 deteriorates when the insertion film 28 is removed by wet etching. When the lower piezoelectric film 14a mainly composed of aluminum nitride is exposed to plasma of fluorine-based gas, Al in the lower piezoelectric film 14a and F react, and the AlF-based film 60, which contains aluminum fluoride such as AlF, $AlF_2$, and $AlF_3$, is formed. The bonding between Al and F is strong, and the AlF-based film 60 is thus not easily removed.

In FIG. 3B, when the photoresist 58 is removed, the organic substance containing film 62 adheres so as to cover the film 60 and the insertion film 28. It is considered that the crystallinity of the upper piezoelectric film 14b deteriorates when the upper piezoelectric film 14b is formed in a state where the films 60 and 62 (or residues) are not sufficiently removed. In the fabrication method leaving the films 60 and 62 out of consideration, the state of the surface of the lower piezoelectric film 14a from FIG. 3A to FIG. 3C has not been considered. This is the reason why the piezoelectric thin film resonator with a low electromechanical coupling coefficient $k^2$ was fabricated as with the sample B.

Figure 9:
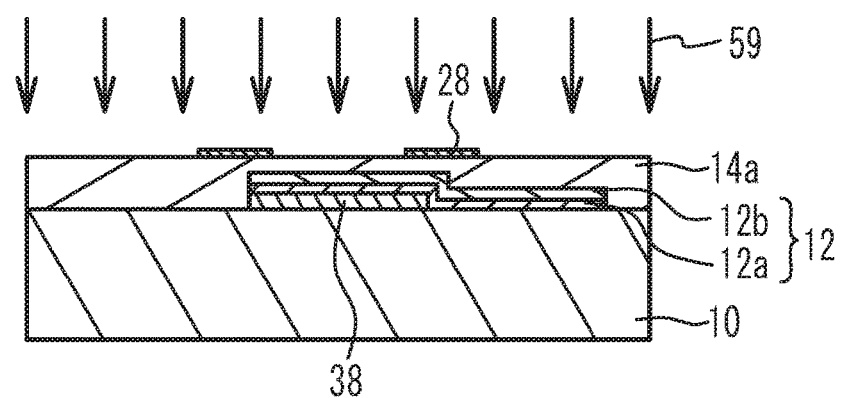
FIG. 9 is a cross-sectional view (No. 3) illustrating the method of fabricating the piezoelectric thin film resonator in accordance with the first embodiment.

The removal of the films 60 and 62 after the process in FIG. 3B and before the process in FIG. 3C was examined. FIG. 9 is a cross-sectional view illustrating the method of fabricating the piezoelectric thin film resonator in accordance with the first embodiment. As illustrated in FIG. 9, after the process in FIG. 3B, as indicated by arrows 59, the film 62 is removed by oxygen ashing. Thereafter, the upper surface of the lower piezoelectric film 14a is etched using argon plasma as indicated by the arrows 59. Argon etching is performed in a magnetron sputtering device. This process removes the film 60. The upper piezoelectric film 14b is then formed as described in FIG. 3C.

The piezoelectric thin film resonators were fabricated by changing an argon etching time. Argon etching was conducted at a flow rate of argon gas of 20 sccm and at Radio Frequency (RF) power of 30 W.

Figure 10:
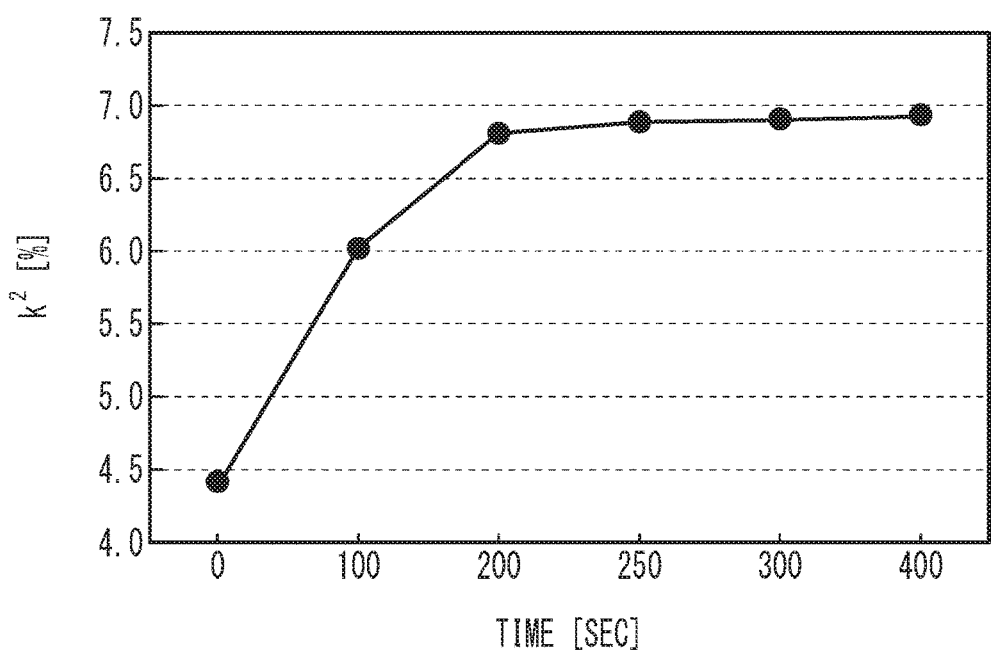
FIG. 10 is a graph of an electromechanical coupling coefficient $k^2$ versus an argon etching time.

FIG. 10 is a graph of an electromechanical coupling coefficient $k^2$ versus an argon etching time. Argon etching times of respective samples are 0 second, 100 seconds, 200 seconds, 250 seconds, 300 seconds, and 400 seconds. In FIG. 10, the horizontal axis represents an argon etching time of each sample. As illustrated in FIG. 10, the electromechanical coupling coefficient $k^2$ without argon etching (when an etching time is 0 second) is approximately 4.5%. As the argon etching time is increased, the electromechanical coupling coefficient $k^2$ becomes approximately 7%. As described above, it is revealed that the electromechanical coupling coefficient is increased by argon etching.

Figure 11A:
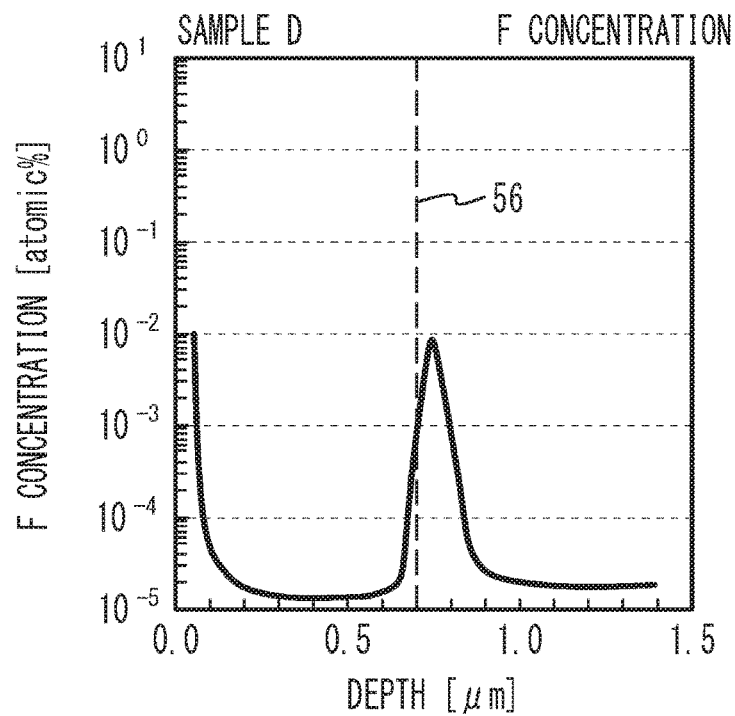
FIG. 11A is a schematic view illustrating an F concentration with respect to a depth in a sample D.
Figure 11B:
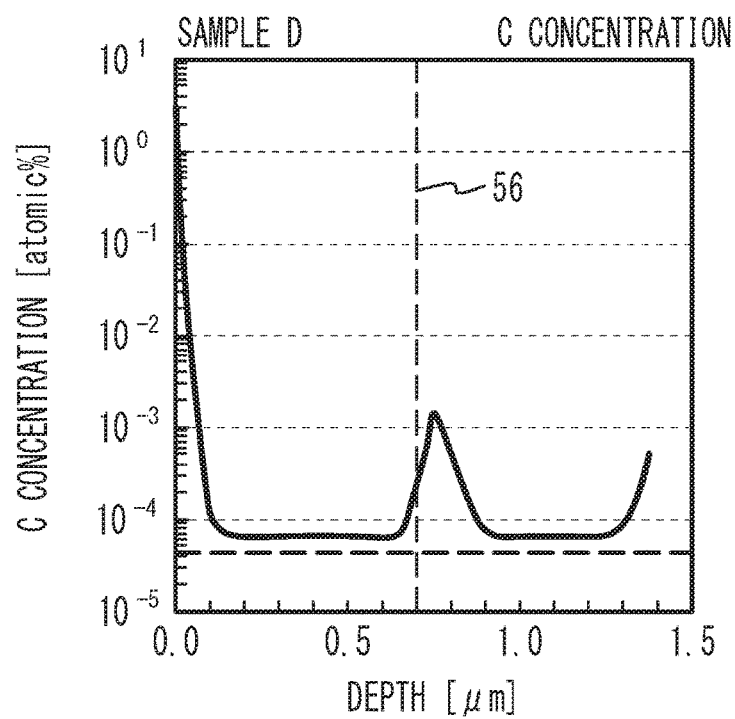
FIG. 11B is a schematic view illustrating a C concentration with respect to a depth in the sample D.

An F concentration and a C concentration with respect to a depth were measured for a sample D of which the argon etching time was 350 seconds. FIG. 11A is a schematic view illustrating an F concentration with respect to a depth in the sample D, and FIG. 11B is a schematic view illustrating a C concentration with respect to a depth in the sample D. As illustrated in FIG. 11A and FIG. 11B, the F concentration and the C concentration reach their peaks near the boundary face 56. The peak F concentration is approximately $8 \times 10^{-3}$ atomic %, and the peak C concentration is approximately $2 \times 10^{-3}$ atomic %. As described above, the F concentration and the C concentration of the sample D are nearly equal to those of the samples A and C. As described above, argon etching reduces the F concentration and the C concentration near the boundary face 56, thereby making the electromechanical coupling coefficient $k^2$ a normal value.

For the fabricated samples, the relationships between the electromechanical coupling coefficient $k^2$ and the peak values of the F concentration, the C concentration, the hydrogen (H) concentration, and the oxygen (O) concentration near the boundary face 56 measured with D-SIMS are illustrated. The samples include samples of which the argon etching time was varied.

Figure 12A:
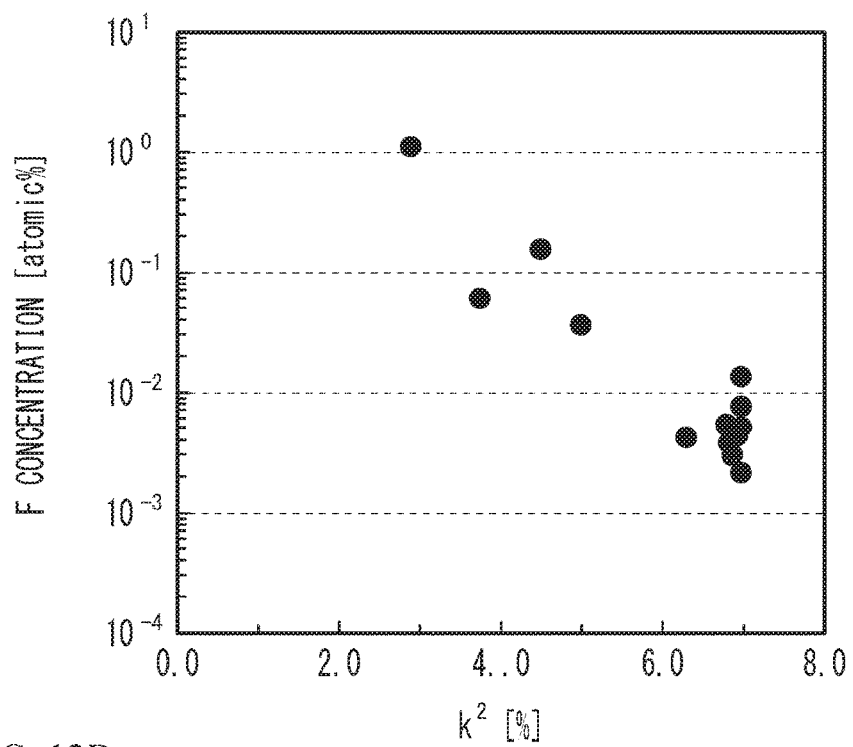
FIG. 12A is a graph of an F concentration versus an electromechanical coupling coefficient.
Figure 12B:
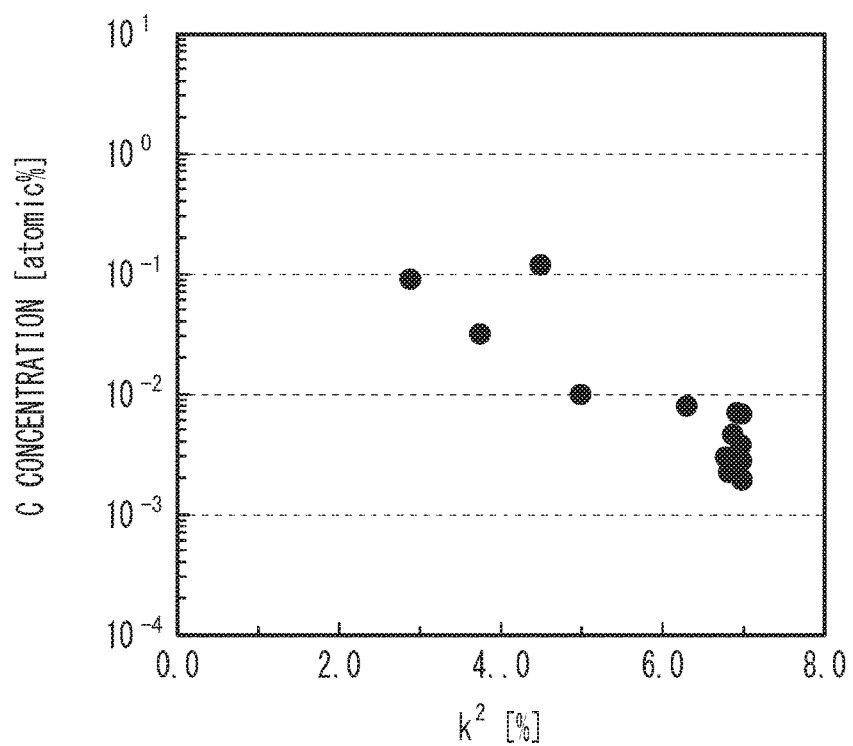
FIG. 12B is a graph of a C concentration versus an electromechanical coupling coefficient.
Figure 13A:
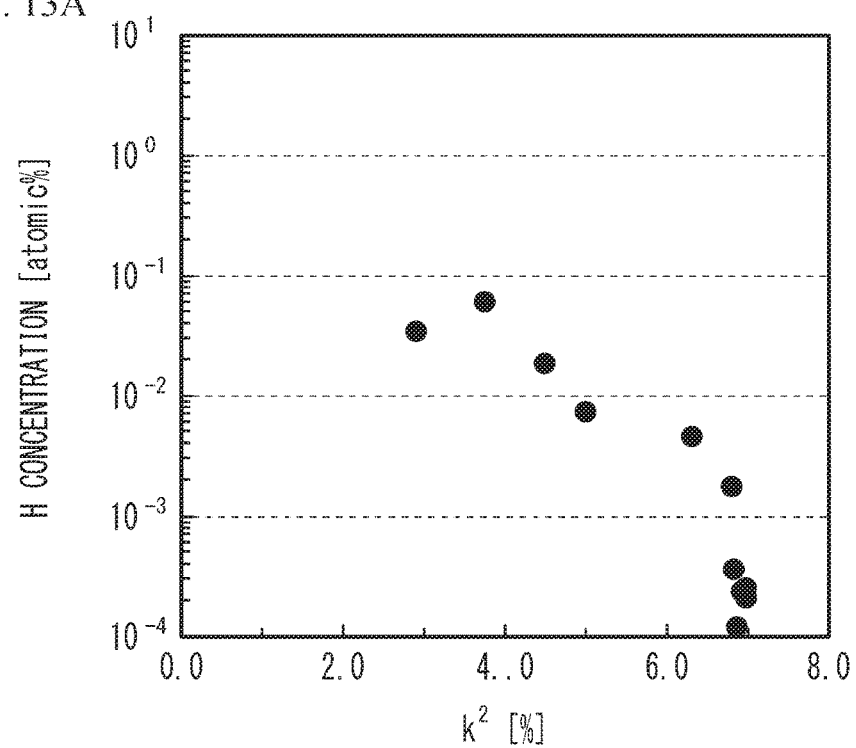
FIG. 13A is a graph of an H concentration versus an electromechanical coupling coefficient.
Figure 13B:
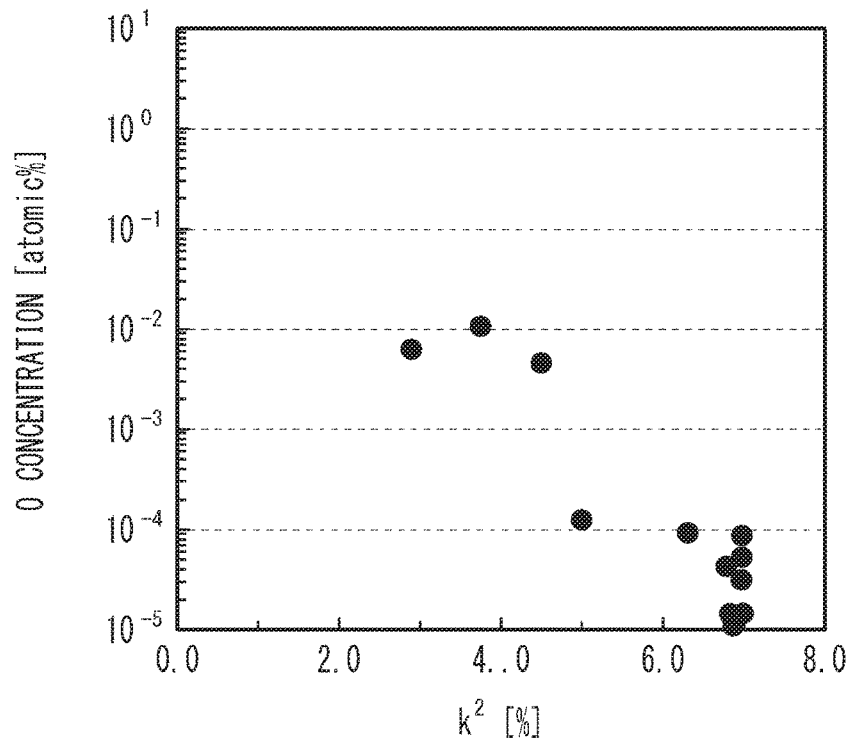
FIG. 13B is a graph of an O concentration versus an electromechanical coupling coefficient.

FIG. 12A is a graph of an F concentration versus an electromechanical coupling coefficient $k^2$, FIG. 12B is a graph of a C concentration versus an electromechanical coupling coefficient $k^2$, FIG. 13A is a graph of an H concentration versus an electromechanical coupling coefficient $k^2$, and FIG. 13B is a graph of an O concentration versus an electromechanical coupling coefficient $k^2$. As illustrated in FIG. 12A, the F concentration is 0.03 atomic % or less around at $k^2$ of 7%. As $k^2$ decreases, the F concentration increases, and the maximum F concentration is 1 atomic %. As illustrated in FIG. 12B, the C concentration is 0.01 atomic % or less around at $k^2$ of 7%. As $k^2$ decreases, the C concentration increases, and the maximum C concentration is 0.1 atomic %.

As illustrated in FIG. 13A, the H concentration is 0.0005 atomic % or less around at $k^2$ of 7%. As $k^2$ decreases, the H concentration increases, and the maximum H concentration is 0.06 atomic %. As illustrated in FIG. 13B, the O concentration is 0.0001 atomic % or less around at $k^2$ of 7%. As $k^2$ decreases, the O concentration increases, and the maximum 0 concentration is 0.01 atomic %.

As described above, $k^2$ correlates with both the H concentration and the O concentration, but the change in F concentration with respect to the change in $k^2$ is the largest. Even if H and O remain near the boundary face 56, it is difficult to believe that the crystallinity of the upper piezoelectric film 14b is thereby deteriorated. Thus, it is considered that the deterioration of the crystallinity of the upper piezoelectric film 14b is affected by F (F bonded with Al) near the boundary face 56.

As in Patent Document 1, it is considered that the roughness of the upper surface of the lower piezoelectric film 14a also affects the crystallinity of the upper piezoelectric film 14b. In FIG. 10, the arithmetic average roughness Ra of the upper surface of the lower piezoelectric film 14a is 3 nm at an argon etching time of 0 second, and is 2 nm at an argon etching time of 300 seconds. It is unlikely that such a small difference in Ra affects the crystallinity of the upper piezoelectric film 14b.

As described above, in FIG. 3B, when the insertion film 28 is etched, an AlF-based film or AlF-based residues are formed on the upper surface of the lower piezoelectric film 14a. In FIG. 3C, when the upper piezoelectric film 14b is formed on the film or the residues, the crystallinity of the upper piezoelectric film 14b deteriorates. This is considered the reason of reduction in the electromechanical coupling coefficient $k^2$.

In the first embodiment, the piezoelectric film 14 has the lower piezoelectric film 14a, which is located on the lower electrode 12 and is mainly composed of aluminum nitride, and the upper piezoelectric film 14b, which is located on the lower piezoelectric film 14a and is mainly composed of aluminum nitride. In at least a part of the resonance region 50, the lower piezoelectric film 14a and the upper piezoelectric film 14b are in contact with each other, and in a region other than the at least a part of the resonance region 50, the insertion film 28 (an insulating film containing silicon oxide) is located between the lower piezoelectric film 14a and the upper piezoelectric film 14b.

In this structure, an AlF-based film may be formed on the upper surface of the lower piezoelectric film 14a in a region where no insertion film 28 is formed. Thus, the crystallinity of the upper piezoelectric film 14b may deteriorate. Deterioration of the crystallinity of the upper piezoelectric film 14b in the resonance region 50 deteriorates the electromechanical coupling coefficient. Thus, the fluorine concentration at the boundary face 56 with which the lower piezoelectric film 14a and the upper piezoelectric film 14b are in contact is made to be 0.03 atomic % or less. This configuration reduces reduction in the electromechanical coupling coefficient $k^2$. The fluorine concentration at the boundary face 56 is preferably 0.02 atomic % or less, more preferably 0.01 atomic % or less.

Additionally, the carbon concentration at the boundary face 56 is preferably 0.01 atomic % or less, more preferably 0.008 atomic % or less, further preferably 0.007 atomic % or less. This configuration further reduces reduction in the electromechanical coupling coefficient $k^2$.

The insertion film 28 is located in at least a part of the outer peripheral region of the resonance region 50, and is not located in the center region 54 of the resonance region 50. This structure inhibits the acoustic wave in the lateral mode from leaking from the resonance region 50 to the outside. Therefore, the Q-value is improved.

As illustrated in FIG. 2C, the insertion film 28 is formed on the lower piezoelectric film 14a mainly composed of aluminum nitride. As illustrated in FIG. 3A, the insertion film 28 is etched with an etching gas containing fluorine. Thereafter, as illustrated in FIG. 9, fluorine on the upper surface of the lower piezoelectric film 14a is reduced. Thereafter, as illustrated in FIG. 3C, the upper piezoelectric film 14b mainly composed of aluminum nitride is formed so as to be in contact with the upper surface of the lower piezoelectric film 14a. The process of FIG. 9 removes F bonded with Al of the lower piezoelectric film 14a at the time of etching the insertion film 28. Therefore, reduction in the electromechanical coupling coefficient $k^2$ is reduced.

As illustrated in FIG. 3A, the insertion film 28 is etched using the photoresist 58 as a mask, and as illustrated in FIG. 3B, the photoresist 58 is then removed. As described above, the use of the photoresist 58 as a mask forms the organic substance containing film 62 on the AlF-based film 60, thereby making removal of the AlF-base film 60 difficult. Thus, as illustrated in FIG. 9, it is preferably to provide a process for purposely removing fluorine.

Fluorine on the upper surface of the lower piezoelectric film 14a may be reduced by, for example, exposing the upper surface of the lower piezoelectric film 14a to a gas that nitrides an AlF-based film. F in the AlF-based film is nitrided and thereby becomes HF through this process. HF easily evaporates, and fluorine on the upper surface of the lower piezoelectric film 14a is thus reduced. For example, at 300 to 400° C., the upper surface of the lower piezoelectric film 14a is exposed to a gas atmosphere containing $NH_3$. This reduces fluorine on the upper surface of the lower piezoelectric film 14a.

In the first embodiment, the piezoelectric film 14 is formed by reactive magnetron sputtering, but the piezoelectric film 14 may be formed by vacuum evaporation or CVD. An example in which the insertion film 28 is a silicon oxide film has been described, but a fluorine-based gas is used as an etching gas when the insertion film 28 is an insulating film containing silicon oxide. Thus, an AlF-based film may be formed on the upper surface of the lower piezoelectric film 14a. Therefore, the fluorine concentration at the boundary face 56 is preferably made to be 0.03 atomic % or less.

First Variation of the First Embodiment

Figure 14A:
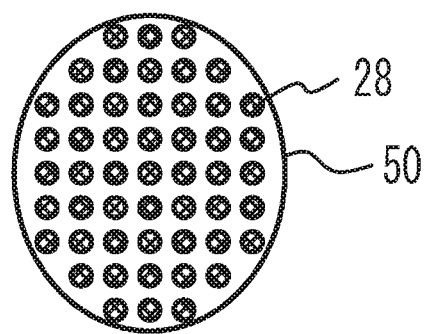
FIG. 14A and FIG. 14B are plan views of the vicinity of a resonance region in accordance with a first variation of the first embodiment.
Figure 14B:
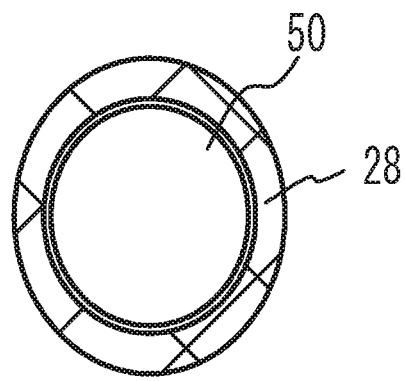

FIG. 14A and FIG. 14B are plan views near the resonance region in accordance with a first variation of the first embodiment. In FIG. 14A and FIG. 14B, the resonance region 50 and the insertion film 28 are illustrated. As illustrated in FIG. 14A, a plurality of the insertion films 28 may be located in the resonance region 50. As illustrated in FIG. 14B, the insertion film 28 may be located outside the resonance region 50. As described above, it is sufficient if the insertion film 28 is interposed between the lower piezoelectric film 14a and the upper piezoelectric film 14b.

Second Embodiment

Figure 15A:
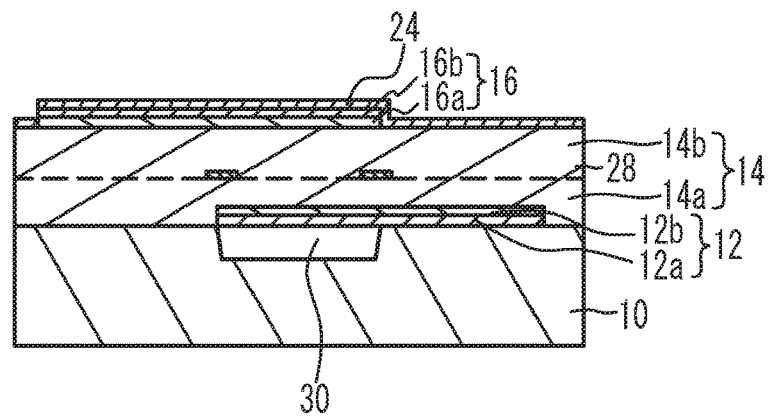
FIG. 15A through FIG. 15C are cross-sectional views of piezoelectric thin film resonators in accordance with a second embodiment and first and second variations thereof, respectively.
Figure 15B:
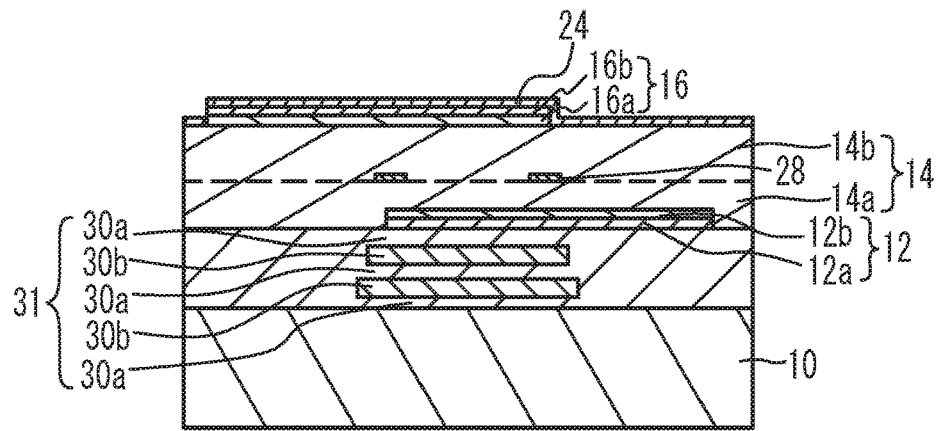

A second embodiment and a first variation thereof change the structure of the air gap. FIG. 15A and FIG. 15B are cross-sectional views of piezoelectric thin film resonators in accordance with the second embodiment and the first variation thereof, respectively. As illustrated in FIG. 15A, a recessed portion is formed on the upper surface of the substrate 10. The lower electrode 12 is flatly formed on the substrate 10. This structure forms the air gap 30 in the recessed portion of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film being in contact with the lower surface of the lower electrode 12 may be formed. That is, the air gap 30 may be formed between the substrate 10 and the insulating film being in contact with the lower electrode 12. The insulating film may be, for example, an aluminum nitride film.

First Variation of the Second Embodiment

As illustrated in FIG. 15B, an acoustic mirror 31 is formed under the lower electrode 12 in the resonance region 50. The acoustic mirror 31 includes a film 30a with low acoustic impedance and a film 30b with high acoustic impedance alternately stacked. Each of the films 30a and 30b has a film thickness of, for example, λ/4 (λ is the wavelength of the acoustic wave). The number of the films 30a and the films 30b that are stacked is freely selected. It is sufficient if the acoustic mirror 31 is formed by stacking two layers with different acoustic characteristics at intervals. Additionally, the substrate 10 may be a single layer of two layers with different acoustic characteristics of the acoustic mirror 31. For example, the acoustic mirror 31 may have a structure in which a single-layer film with acoustic impedance different from that of the substrate 10 is located in the substrate 10. Other structures are the same as those of the first embodiment and the first variation thereof, and the description thereof is thus omitted.

In the first embodiment and the first variation thereof, the air gap 30 may be formed as in the second embodiment, and the acoustic mirror 31 may be formed instead of the air gap 30 as in the first variation of the second embodiment.

As in the first embodiment, the first variation of the first embodiment, and the second embodiment, the piezoelectric thin film resonator may be a Film Bulk Acoustic Resonator (FBAR) in which the air gap 30 is formed between the substrate 10 and the lower electrode 12 in the resonance region 50. Alternatively, as in the first variation of the second embodiment, the piezoelectric thin film resonator may be a Solidly Mounted Resonator (SMR) in which the acoustic mirror 31 reflecting the acoustic wave propagating through the piezoelectric film 14 is located under the lower electrode 12 in the resonance region 50. It is sufficient if an acoustic reflection layer including the resonance region 50 includes the air gap 30 or the acoustic mirror 31.

Second Variation of the Second Embodiment

Figure 15C:
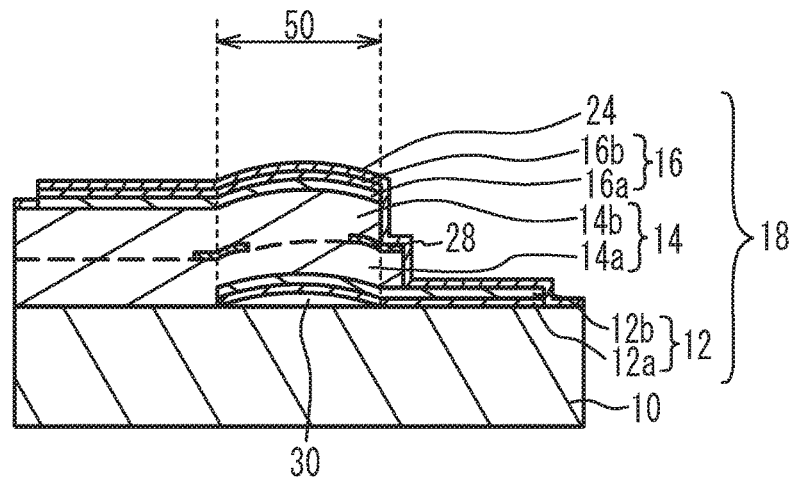

FIG. 15C is a cross-sectional view of a piezoelectric thin film resonator in accordance with a second variation of the second embodiment. As illustrated in FIG. 15C, in an extraction region of the lower electrode 12, the end face of the upper piezoelectric film 14b is substantially aligned with the outline of the resonance region 50. The end face of the lower piezoelectric film 14a is located further out than the outline of the resonance region 50. Other structures are the same as those of the first embodiment, and the description thereof is thus omitted.

As in the second variation of the second embodiment, the piezoelectric film 14 may be located in a staircase arrangement as in the first and second embodiments and the variations thereof.

The first and second embodiments and the variations thereof have described an example in which the planar shape of the resonance region 50 is an elliptical shape, but the planar shape of the resonance region 50 may be a polygonal shape such as a quadrangle shape or a pentagonal shape.

Third Embodiment

Figure 16:
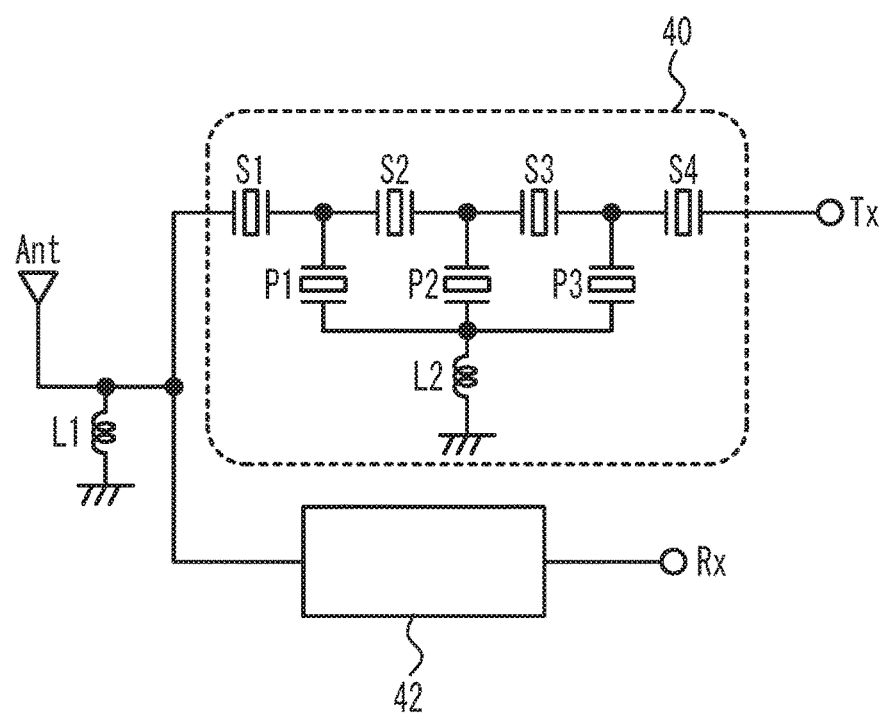
FIG. 16 is a circuit diagram of a duplexer in accordance with a third embodiment.

A third embodiment is an exemplary duplexer. FIG. 16 is a circuit diagram of a duplexer in accordance with the third embodiment. As illustrated in FIG. 16, the duplexer includes a transmit filter 40 and a receive filter 42. The transmit filter 40 is connected between a common terminal Ant and a transmit terminal Tx. The receive filter 42 is connected between the common terminal Ant and a receive terminal Rx. An inductor L1 as a matching circuit is located between the common terminal Ant and a ground. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The inductor L1 matches the impedance so that the transmission signal passing through the transmit filter 40 does not leak to the receive filter 42 and is output from the common terminal Ant.

The transmit filter 40 is a ladder-type filter. One or more series resonators S1 through S4 are connected in series between the transmit terminal Tx (an input terminal) and the common terminal Ant (an output terminal). One or more parallel resonators P1 through P3 are connected in parallel between the transmit terminal Tx and the common terminal Ant. Ground terminals of the parallel resonators P1 through P3 are grounded through an inductor L2. The numbers and connections of the series resonators, the parallel resonators, and the inductors may be appropriately changed to achieve desired transmit filter characteristics. At least one of the series resonators S1 through S4 and the parallel resonators P1 through P3 may be the piezoelectric thin film resonator according to any one of the first and second embodiments and the variations thereof.

Figure 17A:
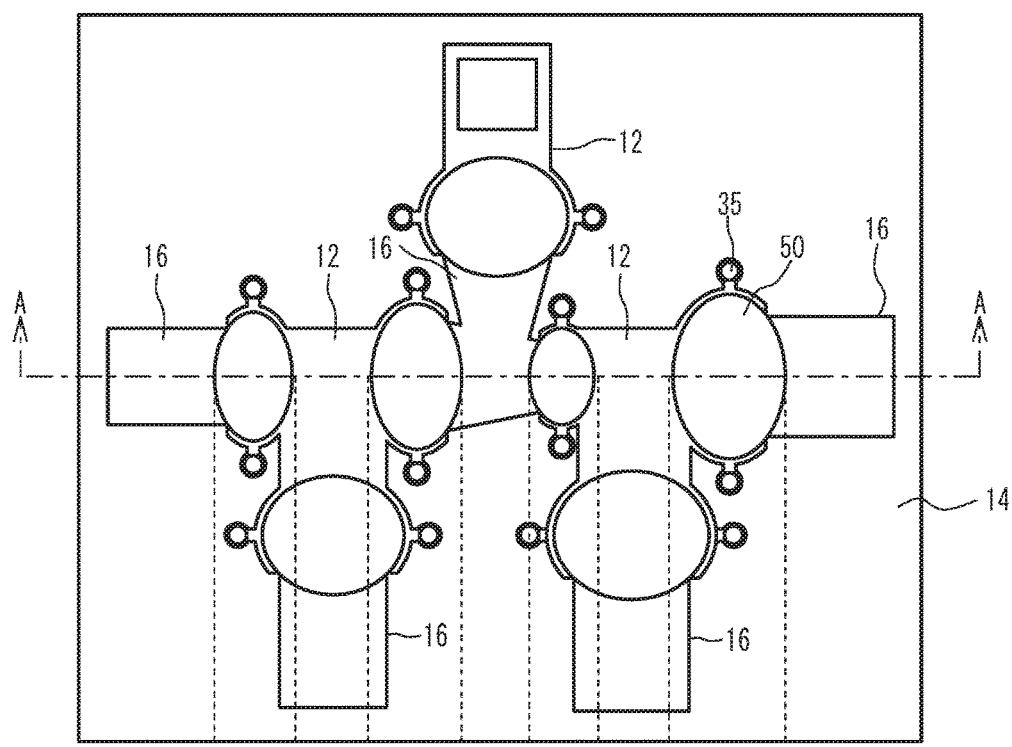
FIG. 17A is a plan view of a transmit filter in the third embodiment.
Figure 17B:
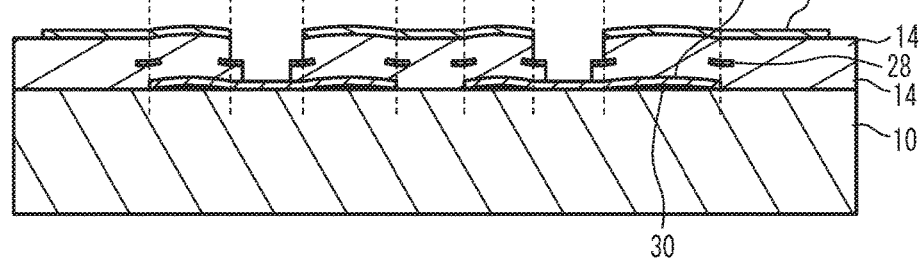
FIG. 17B is a cross-sectional view taken along line A-A in FIG. 17A.

FIG. 17A is a plan view of the transmit filter in the third embodiment, and FIG. 17B is a cross-sectional view taken along line A-A in FIG. 17A. As illustrated in FIG. 17A and FIG. 17B, the piezoelectric thin film resonators of the first embodiment may be formed on the single substrate 10 to form a ladder-type filter. Other structures are the same as those of the second variation of the second embodiment, and the description thereof is thus omitted. The dimensions and the shape of the resonance region 50 of each of the resonators S1 through S4 and P1 through P3 may be appropriately changed.

The receive filter 42 may be a ladder-type filter or a multimode filter. At least one of the transmit filter 40 and the receive filter 42 may be a ladder-type filter or a lattice-type filter. At least one of the resonators of the transmit filter 40 and the receive filter 42 may be the piezoelectric thin film resonator according to any one of the first and second embodiments and the variations thereof.

The filter includes the piezoelectric thin film resonator according to any one of the first and second embodiments and the variations thereof. This structure improves the electromechanical coupling coefficient of the resonator. A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a lower electrode and an upper electrode located on the substrate;
   a piezoelectric film that has a lower piezoelectric film, which is located on the lower electrode and is mainly composed of aluminum nitride, and an upper piezoelectric film, which is located on the lower piezoelectric film and is mainly composed of aluminum nitride, the lower piezoelectric film and the upper piezoelectric film being in contact with each other in at least a part of a resonance region where the lower electrode and the upper electrode face each other across at least a part of the piezoelectric film, a fluorine concentration at a boundary face with which the lower piezoelectric film and the upper piezoelectric film are in contact being 0.03 atomic % or less; and
   an insulating film that is located between the lower piezoelectric film and the upper piezoelectric film in a region other than the at least a part of the resonance region and contains silicon oxide.

2. The piezoelectric thin film resonator according to claim 1, wherein
   the insulating film is located in at least a part of an outer peripheral region of the resonance region, and is not located in a center region of the resonance region.

3. The piezoelectric thin film resonator according to claim 1, wherein
   a carbon concentration at the boundary face is 0.01 atomic % or less.

4. A filter comprising:
   the piezoelectric thin film resonator according to claim 1.

5. A multiplexer comprising:
   the filter according to claim 4.

6. A method of fabricating a piezoelectric thin film resonator, the method comprising:
   forming a lower electrode on a substrate;
   forming a lower piezoelectric film mainly composed of aluminum nitride on the lower electrode;
   forming an insulating film containing silicon oxide on the lower piezoelectric film;
   etching the insulating film with an etching gas containing fluorine;
   reducing fluorine on an upper surface of the lower piezoelectric film after the etching of the insulating film;
   forming an upper piezoelectric film mainly composed of aluminum nitride so that the upper piezoelectric film is in contact with the upper surface of the lower piezoelectric film after the reducing of fluorine; and
   forming an upper electrode on the upper piezoelectric film so that the lower piezoelectric film and the upper piezoelectric film are in contact with each other in at least a part of a resonance region where the upper electrode and the lower electrode sandwich at least a part of a film including the lower piezoelectric film and the upper piezoelectric film.

7. The method according to claim 6, wherein
   the reducing of fluorine includes reducing fluorine on the upper surface of the lower piezoelectric film so that a fluorine concentration at a boundary face with which the lower piezoelectric film and the upper piezoelectric film are in contact is 0.03 atomic % or less.

8. The method according to claim 6, wherein
   the etching of the insulating film includes etching the insulating film using a photoresist as a mask and removing the photoresist.

* * * * *